(12) United States Patent
Krueger et al.

(10) Patent No.: US 8,455,355 B2
(45) Date of Patent: Jun. 4, 2013

(54) METHOD FOR PRODUCING THROUGH-CONTACTS IN SEMI-CONDUCTOR WAFERS VIA PRODUCTION OF THROUGH-PLATED HOLES

(75) Inventors: Olaf Krueger, Berlin (DE); Gerd Schoene, Berlin (DE); Wilfred John, Berlin (DE); Tim Wernicke, Berlin (DE); Joachim Wuerfl, Zeuthen (DE)

(73) Assignee: Forschungsverbund Berlin E.V., Berlin (DE)

( * ) Notice: Subject to any disclaimer, the term of this patent is extended or adjusted under 35 U.S.C. 154(b) by 57 days.

(21) Appl. No.: 11/993,459

(22) PCT Filed: Jul. 24, 2006

(86) PCT No.: PCT/EP2006/064599
§ 371 (c)(1),
(2), (4) Date: Dec. 21, 2007

(87) PCT Pub. No.: WO2007/025812
PCT Pub. Date: Mar. 8, 2007

(65) Prior Publication Data
US 2008/0286963 A1      Nov. 20, 2008

(30) Foreign Application Priority Data
Aug. 31, 2005 (DE) .......................... 10 2005 042 074

(51) Int. Cl.
*H01L 21/44* (2006.01)
(52) U.S. Cl.
USPC ......................................... 438/667; 257/774

(58) Field of Classification Search
USPC ............................................ 438/667; 257/774
See application file for complete search history.

(56) References Cited

U.S. PATENT DOCUMENTS 4,473,737 A * 9/1984 Anthony .................. 219/121.71
4,897,708 A    1/1990 Clements
(Continued)

FOREIGN PATENT DOCUMENTS
WO    02/060636 A1    8/2002

OTHER PUBLICATIONS

Sorab Ghandhi, "VLSI Fabrication Principles" Jan. 6, 1983. John Wiley & Sons, Inc.*
Widmann, D. et al.; "Technologie hochintegrierter Schaltungen" ISBN 3-540-59357-8, Apr. 1996.

(Continued)

*Primary Examiner* — Kimberly Rizkallah
*Assistant Examiner* — Caleb Henry
(74) *Attorney, Agent, or Firm* — Perkins Coie LLP; Aaron Wininger (57) ABSTRACT

The invention relates to a method for producing vertical through-contacts (micro-vias) in semi-conductor wafers in order to produce semi-conductor components, i.e. contacts on the front side of the wafer through the semi-conductor wafer to the rear side of the wafer. The invention also relates to a method which comprises the following steps: blind holes on the contact connection points are laser drilled from the rear side of the wafer into the semi-conductor substrate, the wafer is cleaned, the semi-conductor substrate is plasma etched in a material selected manner until the active layer stack of the wafer is reached, the active layer stack of the wafer is plasma etched in a material selective manner until the contacts, which are to be connected to the rear side of the wafer, are reached, a plating base is applied to the rear side of the wafer and into the blind holes and gold is applied by electrodeposition onto the metallizied rear side of the wafer and the blind holes.

14 Claims, 5 Drawing Sheets

1. Application of protective varnish

U.S. PATENT DOCUMENTS

| | | | |
|---|---|---|---|
| 5,371,042 A * | 12/1994 | Ong | 438/653 |
| 6,110,825 A * | 8/2000 | Mastromatteo et al. | 438/667 |
| 6,902,872 B2 * | 6/2005 | Lai et al. | 430/322 |
| 6,903,442 B2 | 6/2005 | Wood et al. | |
| 7,233,028 B2 * | 6/2007 | Weeks et al. | 257/98 |
| 7,674,719 B2 * | 3/2010 | Li et al. | 438/708 |
| 2001/0028113 A1 | 10/2001 | Kosaki et al. | |
| 2001/0035580 A1 | 11/2001 | Kawai | |
| 2002/0066960 A1 * | 6/2002 | Ring | 257/774 |
| 2002/0086520 A1 * | 7/2002 | Chiang | 438/630 |
| 2004/0072422 A1 | 4/2004 | Sinha | |
| 2004/0188819 A1 | 9/2004 | Farnworth et al. | |

OTHER PUBLICATIONS

L W. Burgess: "Introducing Via-in-Pad Blind Via Technology to Any PCB Multilayer Fabricator", Mar. 1997, San Jose, CA.

A. Cable: "Improvements in High Speed Laser Microvia Formation Using Solid State Nd:YAG UV Lasers", Mar. 1997, San Jose, CA.

M. A Owen: "Via drilling" in: J.F. Ready, D.F. Farson: LIA Handbook of laser materials processing, Laser Institute of America, Magnolia Publishing (2001).

Kim et al: "SiC Via Holes by Laser Drilling", Journal of Electronic Materials, bd. 33, Nr. 5, May 2004, XP008070388.

* cited by examiner

1. Application of protective varnish

Fig. 2

2. Application of rear-side protection

Fig. 3

3. Laser-drilling of rear side

Fig. 4

4. Plasma etching up to contact surfaces

Fig. 5

5. Removal of rear-side protection

Fig. 6

6. Metallization

Fig. 7

7. Removal of protective varnish

1. Application of protective varnish

Fig. 10

2. Laser-drilling from rear side

Fig. 11

3. Plasma etching up to contact surfaces

Fig. 12

4. Metallization

Fig. 13

5. Removal of protective varnish

Fig. 14

METHOD FOR PRODUCING THROUGH-CONTACTS IN SEMI-CONDUCTOR WAFERS VIA PRODUCTION OF THROUGH-PLATED HOLES

FIELD OF THE INVENTION

The invention relates to a method for the production of vertical through-plated holes (micro-vias, pocket hole vias or "blind" vias, via=vertical interconnect access) in semiconductor wafers for the fabrication of semiconductor devices, i.e., of contacts extending from the front side of the wafer, through the semiconductor wafer to the rear side of the wafer.

BACKGROUND

The properties (for example, high-frequency properties) of the devices can be fully utilized only by an increasingly more compact integration into the periphery. Short vertical connections represent an efficient way of electrical contacting. In addition, it is necessary for physical reasons—in order to enhance the amplification and the maximum output power of the high-frequency transistors available per chip—to establish a low-inductance electrically conductive connection between the source contacts on the front side and the ground electrode on the rear side. This, however, cannot always be easily implemented considering the technology.

Electrically active GaN (gallium nitride) material is currently virtually not available as a mono-crystalline wafer material and is thus epitactically grown on substrate materials such as, for example, SiC wafers (silicon carbide).

SiC is noted for its very good thermal conductivity, as well as its extremely high chemical stability and great hardness. Therefore, it is necessary for contacting the rear side of the GaN transistors to drill through the carrier material of SiC, as well as through the superimposed epitactical GaN layer. For texturing, until now only dry-chemical etching processes such as reactive ion etching could be used in practice in high-performance plasma etching reactors that are specifically optimized for this purpose. However, at 1 μm/min, typical plasma etching rates of SiC are very low. In addition, the use of plasma etching technology requires the production and lithographic texturing of a durable etching mask.

It has been known that printed circuit boards can be provided with vias by using lasers. Referring to these technologies, openings can be drilled into the copper layers and dielectric layers, and these can then be metallized in order to create electrical connections between certain layers. Different laser technologies use lasers such as $CO_2$ lasers, frequency-doubled (green) YAG lasers, excimer lasers and UV:YAG lasers.

The production of these vias has been described in the following, for example:

L. W. Burgess: "Introducing Via-in-Pad Blind Via Technology to Any PCB Multilayer Fabricator." IPC Printed Circuits Expo 1997, Mar. 9-13, 1997, San Jose, Calif., S15-2.

A. Cable: "Improvements in High Speed Laser Microvia Formation Using Solid State Nd:YAG UV Lasers." IPC Printed Circuits Expo 1997, Mar. 9-13, 1997, San Jose, Calif., S17-7.

M. D. Owen: "Via drilling." In: J. F. Ready, D. F. Farson (Edtrs.): LIA Handbook of laser materials processing, Laser Institute of America, Magnolia Publishing (2001) 661-665.

At the present time, there is no known laser technology-based method that is known for the production of micro-vias in semiconductor wafers.

SUMMARY

The object of the invention is to provide an effective method for the production of micro-vias in semiconductor wafers of materials displaying great hardness and stability, such as silicon carbide, sapphire or the like.

In accordance with these, the method is characterized by the following steps:

Laser drilling of pocket bores at the contacting sites from the rear side of the wafer into the semiconductor substrate;

Cleaning of the wafer (removal of debris);

Material-selective plasma etching of the semiconductor substrate through to the active layer stack of the wafer;

Material-selective plasma etching of the active layer stack of the wafer until the contacts that are to be connected to the rear side are reached;

Application of a plating base to the rear side of the wafer and to the inside of the pocket holes;

Application of gold by plating the metallized rear side of the wafer and the pocket holes.

In order to protect the wafer during the process, a protective varnish may be applied to the front side of the wafer as a protective measure, said protective varnish being removed again after the process (varnish removal).

In order to avoid a thinning of the semiconductor substrate during the etching process, the rear side of the wafer may be coated with indium tin oxide (ITO) before laser-drilling the pocket bores, said ITO being simply removed again after plasma etching.

In the case of SiC substrate material, cleaning of the wafer to remove debris is practically achieved with buffered hydrofluoric acid.

As the material-selective etching process for the semiconductor substrate, the ICP etching process (inductively coupled plasma) is particularly preferred; for the layer stack, it is the RIE process (reactive ion etching).

As the laser, a UV laser is suitable, preferably a frequency-tripled Nd:YAG laser with a wavelength of 355 nm.

The application of the plating base in the micro-vias may occur with several methods. Preferred is an oblique vapor deposition; also possible are a chemical bath deposition (current-less) or an application by sputtering.

If needed, the gold layer may additionally be coated with a dewetting layer at the locations of the micro-vias. Suitably, titanium is used for the dewetting layer, whereby the titanium may be deposited by sputtering. The dewetting layer is effectively coated with the use of a shadow mask.

The method has the advantage in that micro-vias can be produced in hard and chemically inert substrate materials within a substantially reduced time and with high precision.

In accordance with the method of the present invention, micro-machining of material by means of UV laser radiation is combined with plasma etching and used for direct texturizing in the fabrication of components. In contrast with the production of through-wafer vias (or hollow-rivet vias), there is no full perforation of the material. The residual material is removed by plasma etching up to the contacts of the front side in a material-selective manner. The particular advantage of this is that a resistant etching mask need not be lithographically produced, but that the laser-drilled holes act as the etching mask. If the side that is being machined is protected in a suitable manner, the material density is maintained. In this case, a protective layer that is being perforated by the laser prevents the planar material removal during plasma etching. If no protective layer is used, the removal of material by etching over large areas takes place. The concurrent reduction of the material thickness may be estimated in view of known etching rates.

BRIEF DESCRIPTION OF THE DRAWINGS

Hereinafter, the invention will be explained in detail with reference to an exemplary embodiment. Related schematic drawings show the phases of the inventive method, for example, the production of micro-vias in silicon carbide (SiC) for GaN high-performance field effect transistors or MMICs.

They show in.

DETAILED DESCRIPTION OF THE ILLUSTRATED EMBODIMENTS

Figure 1:
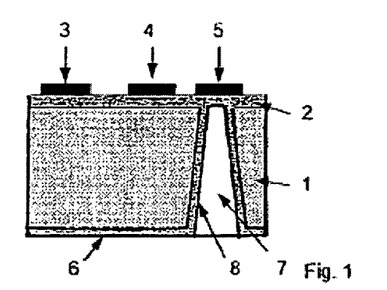
FIG. 1 a cross-section of the general setup of a wafer having a via hole.

FIG. 1 shows the cross-section of a wafer with a transistor setup. The wafer consists of an SiC substrate 1 having a thickness of approximately 250 to 400 µm, on which an AlGaN/GaN layer stack 2 having a thickness of approximately 2 to 3 µm has been epitactically grown. On the layer stack 2 on the front side of the wafer are the connecting contacts of a transistor, namely, a drain contact 3, a gate contact 4 and a source contact 5. The potential of the source contact must be returned to the rear side (ground electrode 6) of the wafer, this being accomplished with the help of a micro-via 7 having metallized hole walls 8, so that the source contact 5 on the front side is electrically connected to the ground electrode 6 on the rear side of the wafer.

Figure 2:
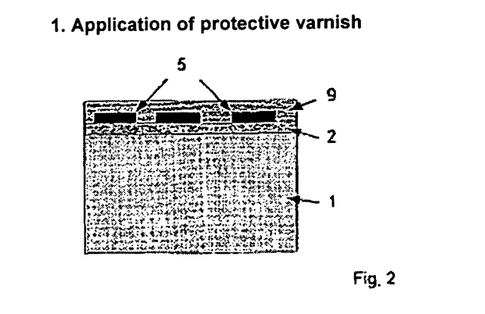
FIG. 2 through FIG. 8 the individual process steps.

Following is a description of the process control of the method in accordance with the invention and of the achieved results. FIGS. 2 through 8 are schematic illustrations of the process sequence. The completely processed GaN transistors or MMICs in the wafer assembly are provided with the micro-vias 7. First, a protective varnish 9 is applied to the front side of the wafer in order to protect the wafer during the subsequent process steps (FIG. 2). Subsequently, a large area of the rear side is coated with a protective layer 10 of indium tin oxide (ITO), said layer having a thickness of 2 µm. However, this step is only necessary if the thickness of the wafer is not to change when the micro-vias 7 are being textured. Then, this protective layer 10 acts as a protection of the SiC surface during etching and will also be removed at the entry openings of the vias during subsequent laser-drilling. Now, the laser is used to drill pocket holes 11 from the rear side of the wafer (FIG. 4). In order to produce the desired pocket holes 11, the laser beam having a diameter of approximately 15 µm is suitably moved across the wafer. The beam movement and the laser parameters can be adjusted in such a manner that the flattest possible topographic profile is created in the vicinity of the SiC/GaN boundary surface.

Loose particles (debris) that may have deposed on the sample during the drilling operation are subsequently removed by a cleaning step using wet chemistry. This is suitably done by etching in buffered hydrofluoric acid with ultrasound.

Figure 5:
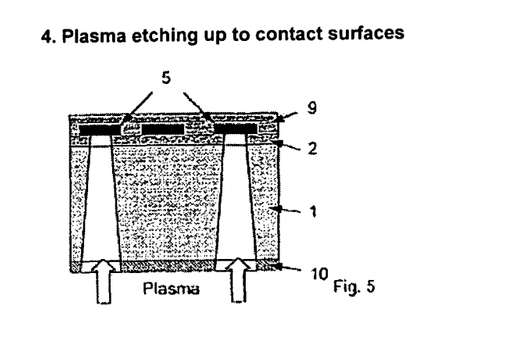

The pocket holes 11 that have been pre-drilled by the laser are subsequently etched through to the front-side contacts by plasma etching with the use of dry chemicals (FIG. 5). It is expedient for the residual SiC to be removed by ICP etching in fluorine-containing gas mixtures (for example, sulfur hexafluoride/oxygen/helium=$SF_6/O_2$/He). By optimizing the etching parameters (partial pressures, temperature), smooth hole walls are achieved. The selectivity of the etching process of SiC versus GaN is >100:1, i.e., good homogeneity of etching may be achieved across a wafer because the etching process on GaN (thickness, approx. 2-3 µm) practically comes to a halt.

The removal of the epitactical layer having a thickness of 2-3 µm (layer stack 2) is accomplished by plasma-chemical means with an RIE process, for example, with boron trichloride/chlorine ($BCl_3/Cl_2$). The selectivity of the dry chemical etching process of GaN versus platinum is >10:1. The metal layer of the front-side contact having a total thickness of approximately 5 µm is now stripped only very gradually, i.e., in practice, the etching process stops at the metal layer. Underetching does not occur. A titanium layer located under the platinum contacts and having a thickness of a few 10 nm is stripped.

Figure 6:
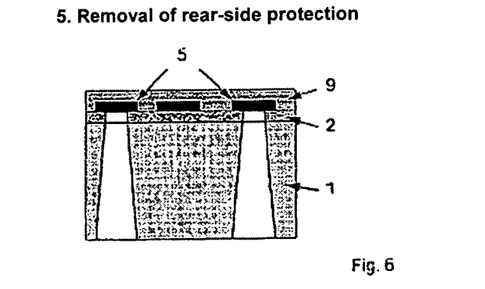

Following the etching process, the potentially applied layer 10 (ITO) may be removed again, this being effectively done with iron-III-chloride (FIG. 6).

Figure 7:
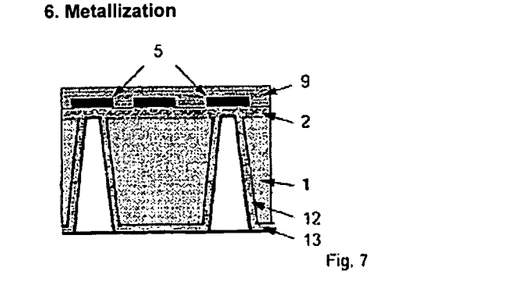

Subsequently, a thin metal layer 12 is vapor-deposited on the rear side of the wafer. In doing so, referring to this exemplary embodiment, a cohesive coverage of the hole walls is achieved by oblique vapor deposition. Also possible are other metallizing processes such as sputtering or currentless chemical deposition. The plating base obtained with the metal layer 12 is subsequently reinforced by applying an electroplated gold layer 13 that typically has a thickness of 5 µm (FIG. 7). In this manner, an electrical connection from one side of the wafer to the other side of the wafer is established with the use of a cohesive gold layer 13.

Figure 8:
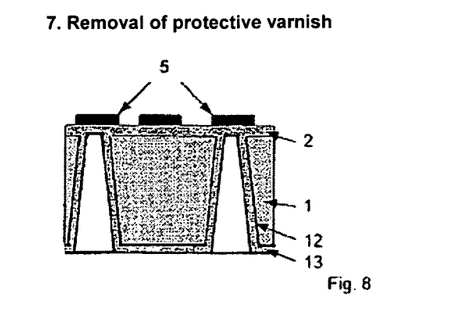

Following metallization, the protective varnish is stripped during another process step (FIG. 8).

If needed, a dewetting layer 14 of titanium may also be applied to the rear side at the via entry openings, namely, a titanium layer having a thickness of 100 nm, said layer being sputtered onto the existing gold layer 13. The dewetting layer 14 is applied in a textured manner to the wafer, whereby a shadow mask is being used. The shadow mask consists of a metal foil having a thickness of 0.1 mm, whereby a laser is used to drill openings into said foil. The layout of the openings in the metal foil corresponds to the arrangement of the micro-vias 7 on the wafer. The diameter of the openings in the shadow mask are slightly larger than the entry diameter of the micro-vias 7 on the rear side of the wafer, so that a titanium ring having a width of approximately 40 µm is formed around the via entry opening. With the use of four additional through bores each at the end of the shadow mask and the wafer, both parts are adjusted relative to each other by means of alignment pins, i.e., said parts are aligned in a congruent manner.

It should be noted that the protective varnish 9 may also be stripped after the deposition of the dewetting layer 14 (titanium dewetting layer).

Figure 9:
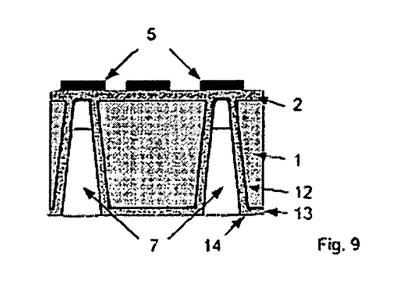
FIG. 9 a cross-section of the wafer with the finished micro-vias.
Figure 10:
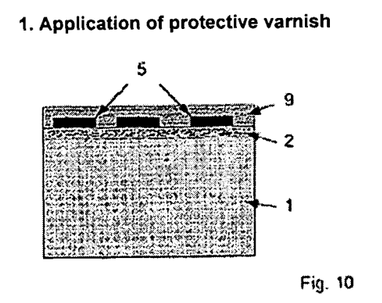
FIG. 10 through FIG. 14 the steps of a second modification of the process.
Figure 11:
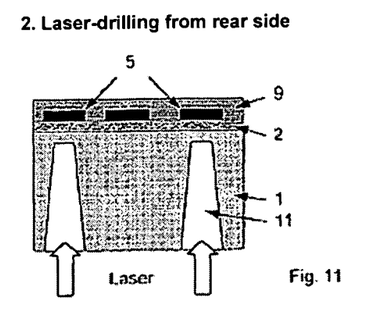
Figure 12:
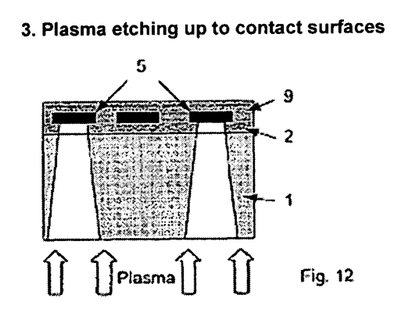
Figure 13:
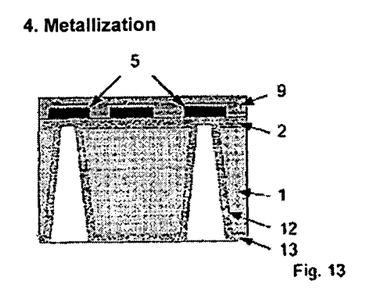
Figure 14:
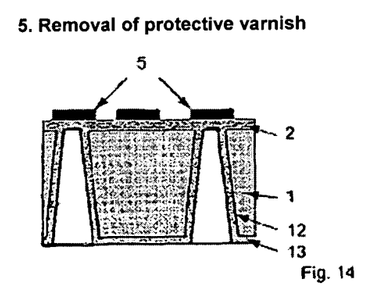

FIG. 9 shows a schematic of a cross-section of the finished micro-vias 7.

Figure 3:
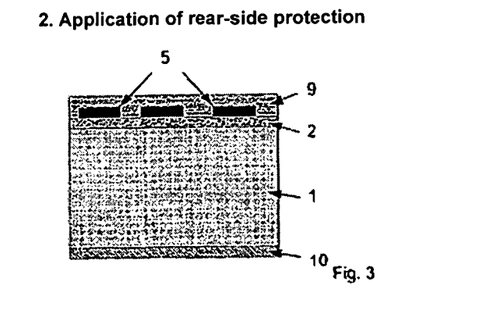
Figure 4:
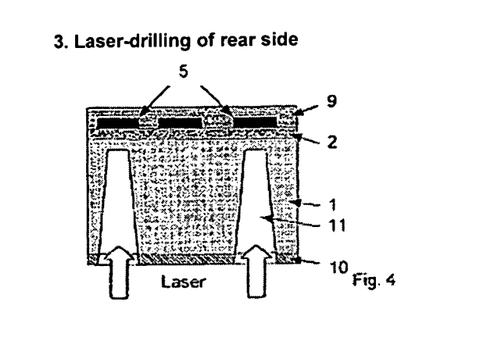

An ITO masking of the surface (protective layer 10) may also be omitted if a controlled reduction of the material thickness during the etching process is acceptable, i.e., the steps in accordance with FIGS. 3 and 6 are not necessary.

FIGS. 10 through 14 show the process sequence applicable in this case. In this case, the process steps correspond to the process steps 1, 3, 4, 6 and 7 of the first example (corresponding to FIGS. 2, 4, 5, 7 and 8).

In this case, the total thickness of the wafer is reduced due to the large-area removal of the SiC. Considering an etching duration of approximately 2 hours, the wafer thickness is reduced from 390 µm to 250-300 µm. At the bottom of the hole, an edge length of 35-70 µm is obtained, whereby the corners are widened hexagonally. The shape of the hole is conical, with a clear widening of the cross-section at the entry, thus facilitating the subsequent coating of the hole wall with metal.

In view of the ablation rate, flexibility and reliability, a frequency-tripled Nd:YAG laser is well-suited for machining the extremely hard and chemically inert SiC. This laser delivers high-energy nanosecond pulses in the ultraviolet region of the spectrum at a wavelength of 355 nm and with pulse frequencies of up to 100 kHz. The laser beam is moved with micrometer accuracy by combining a CNC-controlled movement of the sample table and the beam deflection with a galvo scanner. With the use of image recognition and a highly accurate air-cushioned XY cross table, the laser beam can be positioned with an accuracy of ±1 µm relative to the existing structures on the workpiece. This precision is even achieved when laser texturing occurs on the rear side and the adjustment marks are located on the front side (located on the bottom).

The laser was used to drill pocket holes having a square cross-section and a hole bottom that is as flat as possible. The edge length was approximately 75 µm at the laser entry opening; at the hole bottom, it was approximately 15 µm; approximately 40 µm SiC were left below the hole bottom.

An automated drilling process was used, whereby the respective machining site of the sample was positioned under the beam exit in that the sample table was precisely moved with micrometer accuracy, and then the laser beam was rapidly moved by means of a mirror system (galvo scanner) on the workpiece, whereby an SiC having a thickness of 250-450 µm was used. When viewed in the scanning electron microscope, it can be easily seen that the laser-drilled holes are slightly conical and that a smooth wall with a minimum of deposits can be produced.

Resistance measurements performed on an SiC sample confirmed that a low-ohmic connection can be established between the two sides. To do so, the entire surface of one side of a sample was first metallized with a gold layer having a thickness of 5 µm. Then, from the other side, a matrix of vias was drilled as described above. The distance between the holes was 500 µm. Before measuring the resistance through a single hole, the individual holes had to be electrically separated from each other. To achieve this, the gold layer was severed (scratched) to obtain fields having a size of 500×500 µm$^2$, each field having one via. Highly homogeneous contacting through the SiC sample could be demonstrated with good reproducibility. The resistance values are at 25-31 mΩ. The mean value across the 206 micro-vias is at 27±2 mΩ. The implementable hollow rivets display an aspect ratio of 3-4.

In tests with setup transistors of different types, the functionality of the devices was demonstrated. With reference to the characteristic lines of the transistors, proof was provided of the successful implementation of laser-drilled micro-vias in GaN process technology.

Technological investigations show that it is possible to implement laser-drilled micro-vias through monocrystalline SiC wafer material for high-performance GaN field effect transistors. Proof could be provided that laser-generated micro-texturing can be successfully implemented in device process-technology.

The prerequisite for the application of laser micro-machining in processing semiconductor wafers is the high positioning-accuracy of the beam center of ±1 µm and better. This accuracy relates to beam positioning relative to the existing device structures and must be achieved when machining the front side, as well as when machining the rear side.

The invention allows through-hole plating of the very hard and chemically stable silicon carbide. An aspect ratio of 3-4 was demonstrated therefor.

LIST OF REFERENCE NUMBERS

1 SiC substrate
2 AlGaN/GaN layer stack
3 Drain contact
4 Gate contact
5 Source contact
6 Ground electrode
7 Micro-via
8 Hole wall
9 Protective varnish
10 Protective layer (ITO)
11 Pocket holes
12 Metal layer
13 Gold layer
14 Dewetting layer

The invention claimed is:

1. A method for the production of vertical through-plated holes for the fabrication of contacts extending from a front side of a semiconductor wafer, through the semiconductor wafer to a rear side of the wafer, comprising:
Coating the rear side of the wafer with indium tin oxide (ITO);
Laser drilling of partial pocket holes at the contacting sites from the rear side of the wafer into the semiconductor substrate such that an active layer stack arranged on the front side of the wafer is not reached;
Cleaning of the wafer;
Material-selective plasma etching of the partial pocket holes in the semiconductor substrate through to the active layer stack of the wafer;
Material-selective plasma etching of the active layer stack of the wafer until contacts that are to be connected to the rear side are reached and entire pocket holes are formed;
Removing the indium tin oxide coating from the rear side of the wafer;
Applying a plating base to the rear side of the wafer and to the inside of the entire pocket holes; and
Applying gold by plating the metallized rear side of the wafer and the entire pocket holes.

2. The method of claim 1, wherein before drilling the partial pocket holes with the laser, a protective varnish is applied to the front side of the wafer, said protective varnish being again removed following the gold application.

3. The method of claim 1, wherein cleaning occurs with wet chemistry by means of buffered hydrofluoric acid.

4. The method of claim 1, wherein finally, a dewetting layer is applied to the rear side of the wafer in the region of the entry openings of the through-holes.

5. The method of claim 4, wherein titanium is used for the dewetting layer.

6. The method of claim 4, wherein the dewetting layer is applied by sputtering.

7. The method of claim 4, wherein the application of the dewetting layer takes place with the use of a shadow mask.

8. The method of claim 1, wherein a UV laser is used for laser-drilling.

9. The method of claim 1, wherein the plating base is applied by oblique vapor deposition.

10. The method of claim 1, the plating base is applied by sputtering.

11. The method of claim 1, wherein the plating base is applied by chemical bath deposition.

12. The method of claim 1, wherein for laser-drilling, a laser is used, said laser having a beam that is smaller than the cross-sectional area of the partial pocket hole that is to be produced, whereby the beam is moved across the area of the partial pocket hole.

13. The method of claim 1, wherein plasma-etching of the semiconductor substrate takes place by ICP etching.

14. The method of claim 1, wherein plasma-etching of the active layer stack takes place by RIE etching.

* * * * *